: US 10,533,093 B2

(12) United States Patent
Ono et al.

(10) Patent No.: US 10,533,093 B2
(45) Date of Patent: Jan. 14, 2020

(54) SILICA PARTICLES, RESIN COMPOSITION CONTAINING SAID PARTICLES, AND USE THEREOF

(71) Applicant: NIPPON SHOKUBAI CO., LTD., Osaka (JP)

(72) Inventors: Yuji Ono, Hyogo (JP); Hideki Oishi, Hyogo (JP); Shoichi Shibazaki, Hyogo (JP)

(73) Assignee: NIPPON SHOKUBAI CO., LTD., Osaka (JP)

( * ) Notice: Subject to any disclaimer, the term of this patent is extended or adjusted under 35 U.S.C. 154(b) by 0 days.

(21) Appl. No.: 15/117,583

(22) PCT Filed: Feb. 9, 2015

(86) PCT No.: PCT/JP2015/053556
§ 371 (c)(1),
(2) Date: Aug. 9, 2016

(87) PCT Pub. No.: WO2015/119283
PCT Pub. Date: Aug. 13, 2015

(65) Prior Publication Data
US 2016/0355685 A1 Dec. 8, 2016

(30) Foreign Application Priority Data
Feb. 10, 2014 (JP) .................. 2014-022983

(51) Int. Cl.
*C08K 9/06* (2006.01)
*C09C 1/28* (2006.01)
(Continued)

(52) U.S. Cl.
CPC .............. *C09C 1/3081* (2013.01); *C08K 9/06* (2013.01); *H01L 23/295* (2013.01); *H01L 33/56* (2013.01);
(Continued)

(58) Field of Classification Search
CPC .............. C01P 2002/85; C01P 2004/61; C01P 2004/62; C01P 2004/64; C08K 9/06;
(Continued)

(56) References Cited

U.S. PATENT DOCUMENTS 4,015,031 A 3/1977 Reinhardt et al.
2007/0261601 A1 11/2007 Ikeda et al.
(Continued)

FOREIGN PATENT DOCUMENTS

CN 101052685 10/2007
CN 102015913 4/2011
(Continued)

OTHER PUBLICATIONS https://web.archive.org/web/20130315150858/https://en.wikipedia.org/wiki/Photoemission_spectroscopy, Mar. 2013.*
(Continued)

*Primary Examiner* — Satya B Sastri
(74) *Attorney, Agent, or Firm* — Wenderoth, Lind & Ponack, L.L.P.

(57) ABSTRACT

The object of the present invention is to provide silica particles which are surface-treated with a silicon compound uniformly and have improved surface characteristics and affinity with a resin. The silica particles according the present invention are surface-treated with a specific silicon compound, wherein C/Si ratio from X-ray photoelectron spectroscopy (XPS) is not less than 0.05.

5 Claims, 1 Drawing Sheet

(51) Int. Cl.
*H01L 23/29* (2006.01)
*H01L 33/56* (2010.01)
*C09C 1/30* (2006.01)

(52) U.S. Cl.
CPC ...... *C01P 2004/61* (2013.01); *C01P 2004/62* (2013.01); *C01P 2004/64* (2013.01)

(58) Field of Classification Search
CPC ..... C09C 1/3081; G01R 23/02; H01L 23/295; H01L 33/56
See application file for complete search history.

(56) References Cited

U.S. PATENT DOCUMENTS

| | | | | |
|---|---|---|---|---|
| 2009/0294922 | A1* | 12/2009 | Hamada | H01L 21/02126 257/632 |
| 2011/0048923 | A1 | 3/2011 | Nelson et al. | |
| 2012/0107510 | A1 | 5/2012 | Ito et al. | |
| 2012/0202923 | A1* | 8/2012 | Iriguchi | C01B 33/145 523/466 |
| 2012/0308824 | A1 | 12/2012 | Matsukubo et al. | |

FOREIGN PATENT DOCUMENTS

| | | |
|---|---|---|
| CN | 102532813 | 7/2012 |
| CN | 102725230 | 10/2012 |
| JP | 51-120996 | 10/1976 |
| JP | 3-187913 | 8/1991 |
| JP | 2001-233611 | 8/2001 |
| JP | 2002-079616 | 3/2002 |
| JP | 2004-123454 | 4/2004 |
| JP | 2004123454 A * | 4/2004 |
| JP | 2004123454 A * | 4/2004 |
| JP | 2005-170757 | 6/2005 |
| JP | 2008-137854 | 6/2008 |
| JP | 2008137854 A * | 6/2008 |
| JP | 2009-190956 | 8/2009 |
| JP | 2009-286935 | 12/2009 |
| JP | 2010-228997 | 10/2010 |

OTHER PUBLICATIONS

JP 2004123454 A, Apr. 2004, Machine Translation.*
JP-2008137854-A, Jun. 2008, Machine Translation.*
Notification of Reasons for Rejection dated Apr. 4, 2017 in corresponding Japanese Application No. 2015-561242, with English translation.
First Notification of Office Action dated Mar. 28, 2017 in corresponding Chinese Application No. 201580007726.0, with English translation.
International Search Report dated Mar. 24, 2015 in International (PCT) Application No. PCT/JP2015/053556.
Second Notification of Office Action dated Nov. 16, 2017 in corresponding Chinese Application No. 201580007726.0, with English translation.
Office Action dated Jul. 11, 2018 in Chinese Application No. 201580007726.0, with English translation.
Office Action dated Feb. 19, 2019 in Chinese Patent Application No. 201580007726.0, with English-language translation.
Decision of Rejection dated Jul. 9, 2019 in corresponding Chinese Patent Application No. 201580007726.0, with English translation.

* cited by examiner

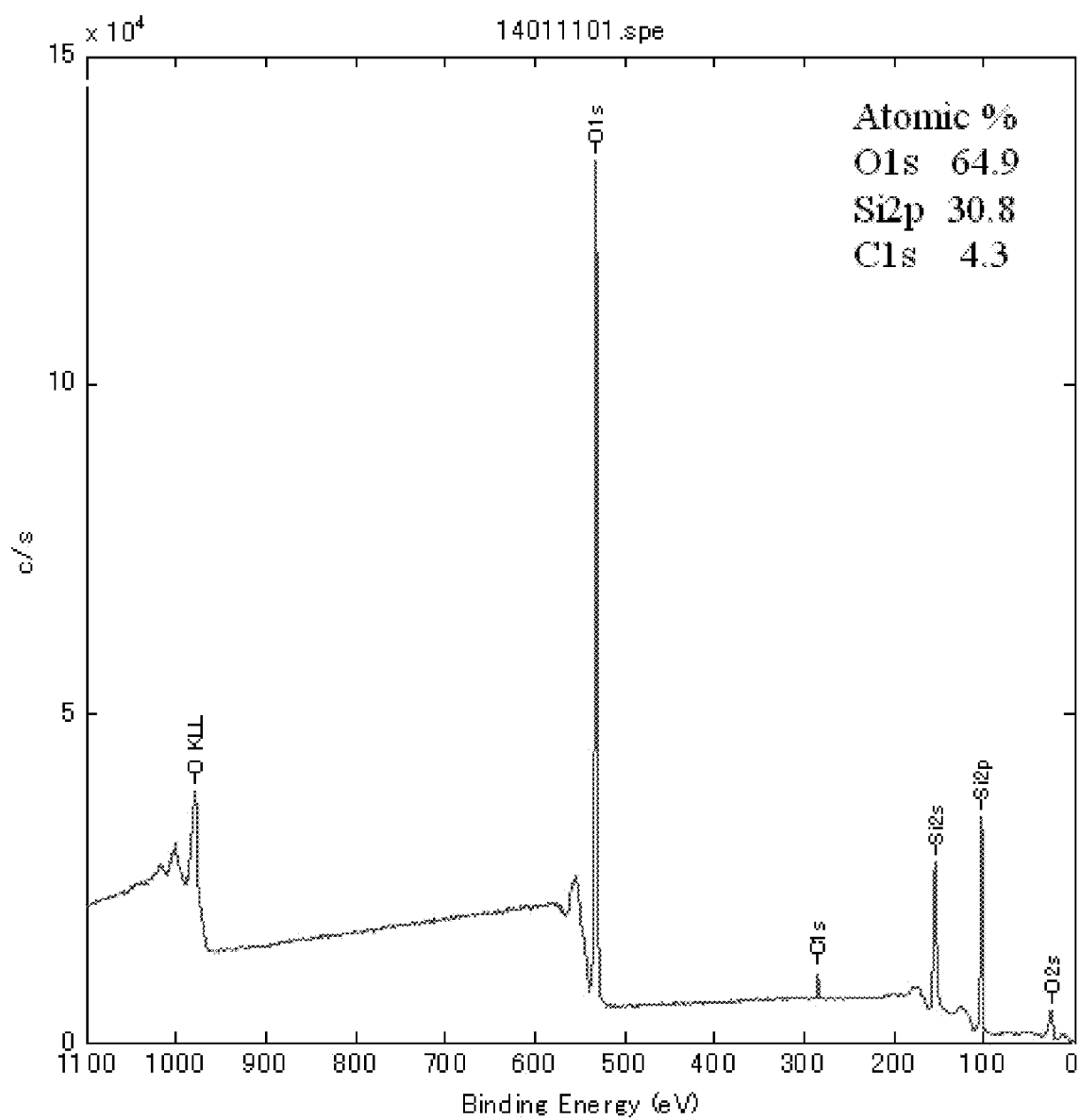

SILICA PARTICLES, RESIN COMPOSITION CONTAINING SAID PARTICLES, AND USE THEREOF

TECHNICAL FIELD

The present invention relates to silica particles surface-treated with a silicon compound.

BACKGROUND ART

Inorganic particulates are used in various fields because they are excellent in strength, and heat resistance. Especially, silica particulates are used widely for antiblocking agents and lubricating agents for various kinds of films such as a polyester film, a polyimide film, and a fluororesin film; spacers such as an in-plane spacer for liquid crystal display elements, a spacer at a seal part for liquid crystal display elements, a spacer for EL display elements, a spacer for touch panels, and a gap-retaining material for various types of substrates such as ceramics, plastics, and the like; encapsulant for various electronic components such as a semiconductor encapsulant, a sealing material for liquid crystal, and an encapsulant for LED light emitting elements; light diffusion agents for light diffusion films, light diffusion plates, light-guiding plates, antiglare films, and the like; additives for cosmetics, such as white extender pigments; dental materials, etc.

In the case where silica particles are used for these applications, silica particles are known to be surface-treated with a surface treating agent such as a silane coupling agent in order to improve the surface characteristics or affinity with a resin as described in Patent Documents 1 to 3 for example.

PRIOR ART DOCUMENTS

Patent Documents

Patent Document 1: JP-A-2008-137854
Patent Document 2: JP-A-2009-190956
Patent Document 3: JP-A-2010-228997

SUMMARY OF THE INVENTION

Problems to be Solved by the Invention

However, in the case where the surface treatment of silica particles is performed with a silicon compound such as a silane coupling agent, it is not easy to surface-treat the entire silica particles uniformly and the unreacted silicon compounds remain on the surface of silica particles. It may result in such influences as secondary aggregation of silica particles or the storage stability decrease for example. Moreover, insufficiently surface-treated silica particles were found to have a problem that the surface characteristics is not uniform and the affinity with a resin is not improved sufficiently.

In view of the situations described above, the object of the present invention is to provide silica particles which are surface-treated with a silicon compound uniformly and have improved surface characteristics and affinity with a resin.

Solutions to the Problems

The present inventors studied to improve the surface characteristics and the affinity of silica particles with a resin, and they found that desired silica particles is obtained by uniformly surface-treating silica particles with a specific silicon compound as a result, and accomplished the present invention.

The silica particles of the present invention is surface-treated with a silicon compound represented by the following general formula (1), wherein C/Si ratio from X-ray photoelectron spectroscopy (XPS) is not less than 0.05, $$R_2SiX_2 \quad (1)$$

wherein R, optionally having a substituent, represents at least one selected from the group consisting of an alkyl group, an aryl group, an aralkyl group and an unsaturated aliphatic residue, and may be either identical or different; and X represents at least one selected from the group consisting of hydroxy group, an alkoxy group and acyloxy group.

The silica particles preferably have an average particle diameter of not less than 0.01 μm and not more than 3 μm.

The amount of the silicon compound unreacted with the silica particles surface is preferably not more than 2% by mass.

The silica particles are preferably for a semiconductor encapsulant.

The present invention includes a resin composition comprising the above silica particles and a resin, and also a semiconductor encapsulant comprising the resin composition

Effects of the Invention

The silica particles of the present invention are uniformly surface-treated with a specific silicon compound.

In addition, the amount of an unreacted silicon compound is small which does not bond to the surface of the silica particles. As a result, the silica particles have improved surface characteristics and affinity with a resin.

BRIEF DESCRIPTION OF THE DRAWINGS

FIG. 1 is an X-ray photoelectron spectroscopy chart of the surface-treated silica particles of Example 2.

MODE FOR CARRYING OUT THE INVENTION

The silica particles of the present invention are surface-treated with a silicon compound represented by the following formula (1) and the C/Si ratio of the silica particles of the present invention from X-ray-photoelectron spectroscopy (XPS) is not less than 0.05, $$R_2SiX_2 \quad (1)$$

wherein R, optionally having a substituent, represents at least one selected from the group consisting of an alkyl group, an aryl group, an aralkyl group and an unsaturated aliphatic residue, and may be either identical or different; and X represents at least one selected from the group consisting of hydroxy group, an alkoxy group and acyloxy group.

The silicon compound is not particularly limited and may be used either solely or in combination of two or more members as long as the effect of the present invention is not impaired.

R preferably include chain alkyl group, such as methyl group, ethyl group, propyl group, butyl group, pentyl group, hexyl group, 2-ethylhexyl group, lauryl group, and stearyl group; cyclic alkyl group, such as cyclohexyl group; aryl group, such as a phenyl group and naphthyl group; aralkyl group, such as benzyl group; and unsaturated aliphatic residues, such as 3-acryloxypropyl group and 3-methacryloxypropyl group in terms of the affinity with a resin to which silica particles are added. The two Rs attached to the single Si may be identical or different. R may have a substituent on an alkyl group, an aryl group, an aralkyl group, or an unsaturated residue. Examples of the substituent include epoxy-containing groups, such as glycidyl group and 3,4-epoxycyclohexyl group, and halogen atoms, and examples of R having such a substituent include 3-glycidoxypropyl group, (3,4-epoxycyclohexyl)ethyl group, chloropropyl group, 3,3,3-trifluoropropyl group and the like.

The number of the carbon atom(s) of R is not less than 1 and is preferably not more than 18, more preferably not more than 10. The number of carbon atom(s) of the chain alkyl group is not less than 1 and is preferably not more than 18, more preferably not more than 5, and even more preferably not more than 3. The number of carbon atom(s) of the cyclic alkyl group is preferably not less than 3, more preferably not less than 5, and is preferably not more than 10, more preferably not more than 7. The number of carbon atom(s) of the aryl group is preferably not less than 6, and is preferably not more than 15, more preferably not more than 10. The number of carbon atom(s) of the unsaturated aliphatic residue is preferably not less than 3, more preferably not less than 4, and is preferably not more than 15, more preferably not more than 10.

The two Rs attached to Si may be either different from each other or identical.

X is not particularly limited, and preferably alkoxy group, such as methoxy group, an ethoxy group, and a butoxy group; hydroxy group; and acyloxy group, such as acetoxy group, and the like. In terms of reactivity, alkoxy group, such as a methoxy group and an ethoxy group, and hydroxy group are more preferable, and alkoxy groups, such as a methoxy group, and hydroxy group are particularly preferable.

Examples of the silicon compound represented by the general formula (1) include dialkyldialkoxysilanes, such as dimethyldimethoxysilane, dimethyldiethoxysilane, dimethyldibutoxysilane, diethyldimethoxysilane, diethyldiethoxysilane, methylphenyldimethoxysilane, dipropyldimethoxysilane, dipropyldiethoxysilane, dibutyldimethoxysilane, dibutyldiethoxysilane, dipentyldimethoxysilane, dipentyldiethoxysilane, dihexyldimethoxysilane, dicyclohexyldimetoxysilane, and cyclohexylmethyldimethoxysilane; diaryldialkoxysilanes, such as diphenyldimethoxysilane; diaralkylalkoxysilanes, such as dibenzyldimethoxysilane; alkylaralkyldialkoxysilanes, such as methylbenzyldimethoxysilane; epoxy group-containing dialkyldialkoxysilanes, such as 3-glycidoxypropylmethyldimetoxysilane and 3-glycidoxypropylmethyldiethoxysilane; unsaturated aliphatic residue-containing dialkyldialkoxysilanes, such as 3-methacryloxypropylmethyldimethoxysilane, 3-methacryloxypropylmethyldiethoxysilane, and 3-methacryloxypropylmethyldiethoxysilane; dialkyldiacyloxysilanes, such as dimethyldiacetoxysilane; and diaryldiacyloxysilanes, such as diphenyldiacetoxysilane. These may be used either solely or in combination of two or more species. From the viewpoint of affinity with a resin and reactivity with a surface of silica particles, dialkyldialkoxysilanes are preferred, dimethyldimethoxysilane and dimethyldiethoxysilane are more preferred, and dimethyldimethoxysilane is particularly preferred.

The silicon compound having the above-mentioned alkoxy group or acyloxy group (preferably alkoxy group) may be (partially) hydrolyzed. In other words, at least one of the alkoxy group and the acyloxy group (preferably alkoxy group) of the silicon compound may be substituted with hydroxy group. Such a silicon compound having hydroxy group is also preferred as the silicon compound represented by the general formula (1). The silicon compound having hydroxy group may be either added as a surface treatment agent, or formed as a result of reaction between a silicon compound having an alkoxy group and water during surface treatment. Specific examples include dialkylsilanediols, such as dimethylsilanediol and diethylsilanediol; diarylsilanediols, such as diphenylsilanediol; and dialkylalkoxyhydroxysilanes, such as dimethylmethoxyhydroxysilane, dimethylethoxyhydroxysilane, and dimethylbutoxyhydroxysilane. They may be used either solely or in combination of two or more and also may be used together with a silicon compound having an alkoxy group or an acyloxy group (preferably an alkoxy group).

In addition to the silicon compound, a silicon compound other than the above-mentioned silicon compound may be used for surface treatment as a silane coupling agent. Examples of such a silane coupling agent include alkoxysilane compounds, chlorosilane compounds, acyloxysilane compounds, silanol compounds, silazanes, silane (Si—H) compounds, and the like.

Examples of the alkoxysilane compounds include vinyl group-containing alkoxysilanes, such as trimethoxyvinylsilane and triethoxyvinylsilane; epoxy group-containing alkoxysilanes, such as 3-glycidoxypropyltrimethoxysilane; methacryloxy group-containing alkoxysilanes, such as 3-methacryloxypropyltrimethoxysilane and 3-methacryloxypropyltriethoxysilane; acryloxy group-containing alkoxysilanes, such as 3-acryloxypropyltrimethoxysilane; mercapto group-containing alkoxysilanes, such as 3-mercaptopropyltrimethoxysilane; amino group-containing alkoxysilanes, such as 3-(2-aminoethylamino)propyltrimethoxysilane, and the like.

Examples of the chlorosilane compounds include 3-chloropropyltrimethoxysilane, methyltrichlorosilane, dimethyldichlorosilane, trimethylchlorosilane, vinyltrichlorosilane, methylvinyldichlorosilane, phenyltrichlorosilane, diphenyldichlorosilane, methyldiphenylchlorosilicane, and the like.

Examples of the acyloxy silane compounds include tetraacetoxysilane, methyltriacetoxysilane, phenyltriacetoxysilane, trimethylacetoxysilane, and the like.

Examples of the silanol compound include trimethylsilanol.

Examples of the silazanes include 1,1,1,3,3,3-hexamethyldisilazane, 1,1,3,3-tetramethyldisilazane, 1,3-bis(3,3,3-trifluoropropyl)-1,1,3,3-tetramethyldisilazane, 1,3-bis(chloromethyl)tetramethyldisilazane, 1,3-diphenyltetramethyldisilazane, 1,3-divinyl-1,1,3,3-tetramethyldisilazane, 2,2,4,4,6,6-hexamethylcyclotrisilazane, 2,4,6-trimethyl-2,4,6-trivinylcyclotrisilazane, heptamethyldisilazane, octamethylcyclotetrasilazane, lithium hexamethyldisilazane, sodium hexamethyldisilazane, potassium hexamethyldisilazane, and the like.

Examples of the silane (Si—H) compounds include 1,1,2,2-tetraphenyldisilane, 1,1,3,3-tetramethyldisiloxane, 1,2-bis(dimethylsilyl)benzene, 2-(dimethylsilyl)pyridine, chlorodiisopropylsilane, chlorodimethylsilane, di-tert-butylsilane, dichloroethylsilane, dichloromethylsilane, diethoxymethylsilane, diethylsilane, dimethoxy(methyl)silane, dimethylphenylsilane, diphenylsilane, diphenylmethylsilane, phenylsilane, N,O-bis(diethylhydrogensilyl)trifluoroacetamide, tert-butyldimethylsilane, tetrakis(dimethylsilyl)silane, tribenzylsilane, tributylsilane, triethoxysilane, triethylsilane, trihexylsilane, triisopropylsilane, triphenylsilane, tris(trimethylsilyl)silane, and the like.

These silane coupling agents may be used solely, or two or more of them may be used in combination. Silazanes, vinyl group-containing alkoxysilanes, and epoxy group-containing alkoxysilanes are preferable among them because dispersibility to resin can be improved thereby. It is preferable not to use a compound containing halogen for halogen-free.

The proportion of the silicon compound represented by the general formula (1) to all of the silicon compounds is preferably not less than 70% by mass, more preferably not less than 90% by mass, even more preferably not less than 95% by mass, and particularly preferably not less than 99% by mass.

The silica particles of the present invention have C/Si ratio from X-ray photoelectron spectrometry (XPS) of not less than 0.05. The lower limit of the C/Si ratio is preferably not less than 0.07, more preferably not less than 0.09. The upper limit is not particularly limited, and is preferably not more than 0.3, more preferably not more than 0.25. With the C/Si ratio in XPS within the above range, silica particles are surface-treated uniformly, and are improved with the surface characteristics or the affinity with a resin.

In X-ray photoelectron spectrometry (XPS), it is possible to observe the elements located within a several nanometers from the surface of the object to be measured. With the measurement of silica particles, it is possible to measure the organic groups (carbon element) contained in the silicon compounds introduced on the silica particle surface, and quantify it in comparison with the ratio of other elements (e.g., silicon). That is, C/Si ratio in XPS represents the ratio of the silicon compounds existing on the surface of the silica particles that is surface-treated with the silicon compound. The specific measurement conditions of XPS are described in EXAMPLES.

The average particle diameter of the silica particles of the present invention is preferably not less than 0.01 μm and not more than 3 μm. The lower limit of the average particle diameter is more preferably not less than 0.05 μm, even more preferably not less than 0.1 μm. The upper limit is more preferably not more than 2.5 μm, even more preferably not more than 2 μm. When the average particle diameter of silica particles is not less than 0.01 μm, the resin viscosity of the resin composition is suppressed. When the average particle diameter of silica particles is not more than 3 μm, the silica particles are applicable to various applications, such as electronic component materials, which requires precision.

In the present description, the average particle diameter means a volume average particle diameter and it is measured by a laser diffraction/scattering method.

The amount of the silicon compound unreacted with the surface (in other words, not bonded to the surface) of the silica particles of the present invention is preferably not more than 2% by mass relative to the silica particles. The amount is more preferably not more than 1.5% by mass, even more preferably not more than 1.2% by mass. When the amount of the silicon compound unreacted with the surface of the silica particles is in the above range, silica particles becomes improved with the surface characteristics or the affinity with a resin. With the amount of the unreacted silicon compound excess 2% by mass, the case may be brought where the compound is volatilized under a heating condition after resin incorporation to form voids in the resin, or the incorporated resin react with the unreacted silicon compound to change the resin characteristics. The amount of the silicon compound unreacted with the surface of the silica particles is based on the mass of the silica particles and it means the amount of the silicon compound contained in the silica particles that is unreacted with the surface of the silica particle. The amount of the silicon compound unreacted with the surface of the silica particles is usually not less than 0% by mass. When the amount of the silicon compound unreacted with the surface of silica particles is less than 0.09% by mass, it may not be detected significantly.

Moreover, in the silica particles of the present invention, it is preferred that the C/Si ratio is increased and the amount of an unreacted silicon compound is reduced. It suppresses the aggregation of silica particles and yields the improvement in the affinity with a resin, as well as the further improvement in dispersibility in a resin composition.

The silicon compound unreacted with the surface of the silica particles means a silicon compound contained in the silica particles (e.g., near the surface or within pores) that is not attached to the surface of the silica particles out of the silicon compounds used for the surface treatment of the silica particles. In the silica particles of the present invention, the amount of a silicon compound unreacted with the surface of the silica particles may be adjusted by adjusting the amount of the silicon compound to be used or alternatively by removing the unreacted silicon compound after treating the surface with a silicon compound. As a method for removing an unreacted silicon compound, preferred method is washing with an organic solvent described as employable solvent in surface treatment in the following. The amount of the silicon compound unreacted with the surface of the silica particles may be measured by measuring the amount of a component that is soluble in the solvent after dispersing the surface-treated silica particles in a solvent that is capable of dissolving the silicon compound and separating the component that is soluble in the solvent from the silica particles. The specific conditions for measurement of the silicon compound unreacted with the surface of silica particles are described in EXAMPLES.

The variation coefficient of the silica particles of the present invention is preferably not more than 30%, more preferably not more than 20%, and particularly preferably not more than 15%. When the variation coefficient of silica particles is within the above-mentioned range, surface treatment can be uniformly performed. Usually, the variation coefficient of silica particles is preferably not less than 1%, more preferably not less than 5%.

The variation coefficient of the particle diameter is calculated as in the following from the average particle diameter and the standard deviation of the particle diameter determined from the measurement by the above-mentioned laser diffraction/scattering particle size distribution analyzer.

Variation coefficient (%)=(standard deviation of the particle diameters)/(average particle diameter)×100

The shape of the silica particles of the present invention is preferably an approximately spherical shape. The ratio of the shortest diameter to the longest diameter of the particles (shortest diameter/longest diameter) is preferably not less than 0.90, more preferably not less than 0.92, even more preferably not less than 0.95, and particularly preferably not less than 0.98. Presence of an angular part may cause damage of interconnection when the silica particles are used as an additive for semiconductor encapsulation resin. The shape of silica can be confirmed by an observation with a scanning electron microscope, or a transmission electron microscope.

The content of coarse particles of the silica particles of the present invention is preferably not more than 0.05% by mass of all the silica particles, more preferably not more than 0.02% by mass, even more preferably not more than 0.01% by mass, and particularly preferably not more than 0.005% by mass. When the content of the coarse particles is not more than 0.05% by mass, the damage on vulnerable metal wires such as interconnection can be suppressed when the silica particles are used as filler for an encapsulant at the time of encapsulating IC chips or LED elements and curing. Especially, the permeability into small gaps can be improved when it is used as an underfill encapsulant. The content of the coarse particles of the silica particles is usually not less than 0% by mass. Coarse particles means the particles which remain on a sieve with an opening of 20 μm after sieving.

The silica particles of the present invention are used preferably for encapsulant. In particular, they are suitably used for semiconductor encapsulant, especially, for underfill encapsulant. The underfill encapsulant means a curable resin composition to be poured into a gap between objects to be sealed (e.g., a gap between a semiconductor chip and a substrate, and a gap between solder balls), of encapsulants. Since the silica particles of the present invention are surface-treated uniformly and the surface characteristic and the affinity with a resin are improved as described above, they can be used suitably for a component which permeates light directly, such as an LED encapsulant and a liquid crystal sealing material, or a component surrounding a part which permeates light.

The present invention also includes a resin composition comprising the silica particles described above and a resin. A semiconductor encapsulant comprising the resin composition is also included. Since the surface characteristics and the affinity with a resin is improved in the silica particles of the present invention, the dispersibility of the silica particles in a resin composition is good, and the viscosity of the resin composition is suppressed.

The viscosity of the resin composition is preferably not more than 400 Pa·s, for example, more preferably not more than 300 Pa·s, even more preferably not more than 250 Pa·s. The viscosity of the resin composition tend to increase with larger particle diameter of the silica particles to be used, and the viscosity is preferable no more than 30 Pa·s, more preferably not more than 27 Pa·s when the average particle diameter of the silica particles is not less than 0.9 μm, for example. A lower viscosity of a dispersion liquid represents the good dispersibility of organically-coated silica. The lower limit of the dispersion liquid viscosity is not particularly limited, and it is 0.1 Pa·s for example, and preferably 1 Pa·s.

The content of the silica particles in the resin composition is preferably not less than 50 parts by mass (more preferably not less than 80 parts by mass, even more preferably not less than 100 parts by mass) and is preferably not more than 250 parts by mass (more preferably not more than 220 parts by mass, even more preferably not more than 200 parts by mass or less), relative to 100 parts by mass of the resin component.

Examples of the resin include epoxy resin, silicone resin, polyimide resin, and polyamide resin. The resins may be used solely or two or more of them may be used in combination. Preferred among them is epoxy resin since the effects are remarkable when the silica particles of the present invention are used as described previously. That is, the resin composition of the present invention is preferably an epoxy resin-based resin composition comprising silica particles and an epoxy resin.

Examples of the epoxy resin include aromatic epoxy compounds, aliphatic epoxy compounds, alicyclic epoxy compounds, and hydrogenated epoxy compounds. The alicyclic epoxy compounds and hydrogenated epoxy compounds are preferred among them from the viewpoint that a cured product (encapsulation) is easily obtained which is excellent in heat resistance or light resistance.

The aromatic epoxy compounds are those having both an aromatic ring and an epoxy group in one molecule. Preferred as the aromatic epoxy compounds are glycidyl compounds having an aromatic cyclic conjugated system such as a bisphenol skeleton a fluorene skeleton, a biphenyl skeleton, a naphthalene ring, and an anthracene ring, for example. Specifically, bisphenol A type epoxy compounds, bisphenol F type epoxy compounds, fluorene-based epoxy compounds, aromatic epoxy compounds having a bromo-substituent, and the like are preferred, and bisphenol A type epoxy compounds, bisphenol F type epoxy compounds, and the like are more preferred.

Aromatic glycidyl ether compounds are also preferred as the aromatic epoxy compounds. Examples of the aromatic glycidyl ether compounds include epibis-type glycidyl ester epoxy resins, high molecular weight epibis-type glycidyl ether epoxy resins, and novolac aralkyl type glycidyl ether epoxy resins and the like.

Aliphatic glycidyl ether type epoxy resins, for example, are preferred as the aliphatic epoxy compounds. Examples of the aliphatic glycidyl ether type epoxy resins include those obtained via a condensation reaction of a polyol compound with epihalohydrin. Examples of the polyol compounds include glycols, such as ethylene glycol, diethylene glycol, triethylene glycol, tetraethylene glycol, polyethylene glycol (PEG600), propylene glycol, dipropylene glycol, tripropylene glycol, tetrapropylene glycol and polypropylene glycol (PPG); glycerols, such as glycerol, diglycerol, tetraglycerol, and polyglycerol; trimethylolpropane and multimers thereof; pentaerythritol and multimers thereof; and mono/polysaccharides, such as glucose, fructose, lactose, and maltose; those having a propylene glycol skeleton, an alkylene skeleton, or an oxyalkylene skeleton are suitable. As the aliphatic glycidyl ether type epoxy resin, aliphatic glycidyl ether type epoxy resins having a propylene glycol skeleton, an alkylene skeleton, and an oxyalkylene skeleton in core scaffolds are suitable.

The alicyclic epoxy compounds represent compounds having an alicyclic epoxy group. Examples of the alicyclic epoxy group include an epoxycyclohexane group (epoxycyclohexane skeleton) and an epoxy group added to a cyclic aliphatic hydrocarbon directly or via a hydrocarbon.

Examples of the alicyclic epoxy compounds include epoxy compounds having an epoxycyclohexane group, such as 3,4-epoxycyclohexylmethyl-3',4'-epoxycyclohexanecarboxylate, □-caprolactone-modified 3,4-epoxycyclohexylmethyl 3',4'-epoxycyclohexanecarboxylate, and bis-(3,4-epoxycyclohexyl) adipate; and hetero ring-containing epoxy resins, such as a 1,2-epoxy-4-(2-oxiranyl)cyclohexane adduct of 2,2-bis(hydroxymethyl)-1-butanol and triglycidyl isocyanurate and the like. The compounds having an epoxycyclohexane group are preferred among them. Polyfunctional alicyclic epoxy compounds having two or more alicyclic epoxy groups in one molecule are suitable from the viewpoint that they can further increase the curing rate. Compounds having one alicyclic epoxy group in one molecule and an unsaturated double bond group such as a vinyl group are also preferably used.

The aforementioned hydrogenated epoxy compound represents a compound obtained by hydrogenating (reducing)

an unsaturated bond of a compound having an unsaturated bond and an epoxy group in the molecule. The hydrogenated epoxy compound is preferably a compound having a glycidyl ether group directly or indirectly attached to a saturated alicyclic hydrocarbon skeleton, and polyfunctional glycidyl ether compounds are suitable. The hydrogenated epoxy compound is preferably a completely or partially hydrogenated compound of an aromatic epoxy compound, more preferably a hydrogenated aromatic glycidyl ether compound, and even more preferably a hydrogenated aromatic polyfunctional glycidyl ether compound. Specifically, hydrogenated compounds of bisphenol A type epoxy compounds, bisphenol S type epoxy compounds, and bisphenol F type epoxy compounds, that is, hydrogenated bisphenol A type epoxy compounds, hydrogenated bisphenol S type epoxy compounds, and hydrogenated bisphenol F type epoxy compounds are preferred. Hydrogenated bisphenol A type epoxy compounds and hydrogenated bisphenol F type epoxy compounds are more preferable.

In the epoxy resin-based resin composition, conventionally known curing agents for epoxy resins can be used in order to cure the epoxy resin as a resin component. As the curing agent, available are acid anhydrides such as maleic anhydride; novolac type resins such as phenol novolac and cresol novolac; and amines such as metaphenylenediamine.

In the epoxy resin-based resin composition, a form containing a cationic curing catalyst in place of the aforementioned addition type curing agent is also preferable. As the cationic curing catalyst, available are thermal cationic curing catalysts and photo-cationic curing catalysts which are conventionally known.

The thermal cationic curing catalyst is also called a thermal acid generator or a thermal cationic polymerization initiator and it exerts a substantial function as a curing agent when it reaches at the curing temperature in a curable resin composition. Preferable examples of the thermal cationic curing catalyst include compounds represented by the following general formula (2):

$$(R^1_a R^2_b R^3_c R^4_d Z)^{+s}(AX_t)^{-s} \quad (2)$$

wherein Z represents at least one element selected from the group consisting of S, Se, Te, P, As, Sb, Bi, O, N and halogen elements; $R^1$, $R^2$, $R^3$, and $R^4$ are the same or different each other and represent organic groups; each of a, b, c, and d is 0 or a positive number and the sum total of a, b, c, and d is equal to the valence of Z; cation $(R^1_a R^2_b R^3_c R^4_d Z)^{+s}$ represents an onium salt; A represents a metal element or metalloid element as the center atom of the halide complex, and is at least one selected from the group consisting of B, P, As, Sb, Al, Ca, In, Ti, Zn, Sc, V, Cr, Mn and Co; X represents a halogen element; s is the net electric charge of the halide complex ion; and t is the number of the halogen elements of the halide complex ion.

Specific examples of the anion $(AX_t)^{-s}$ in the general formula (2) include tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$). Further, an anion represented by the general formula $AX_t(OH)^-$ or other anions can also be used instead of $(AX_t)^{-s}$ of the formula (2). Examples of such other anions include perchlorate ion ($ClO_4^-$), trifluoromethylsulfite ion ($CF_3SO_3^-$), fluorosulfonate ion ($FSO_3^-$), toluenesulfonate ion, and trinitrobenzenesulfonate ion.

Specific examples of commercial products of the thermal cationic curing catalyst include diazonium salt type products such as AMERICURE series (manufactured by American Can Company), ULTRASET series (manufactured by ADEKA CORPORATION), and WPAG series (manufactured by Wako Pure Chemical Industries, Ltd.); iodonium salt type products such as UVE series (manufactured by General Electric Company), FC series (manufactured by 3M), UV 9310 C (manufactured by GE Toshiba Silicones Co., Ltd.), Photoinitiator 2074 (manufactured by Rhone-Poulenc), and WPI series (manufactured by Wako Pure Chemical Industries, Ltd.); and sulfonium salt type products such as CYRACURE series (manufactured by Union Carbide Corporation), UVI series (manufactured by General Electric Company), FC series (manufactured by 3M), CD series (manufactured by Sartomer Company, Inc.), Optomer SP series and Optomer CP series (manufactured by ADEKA CORPORATION), San-Aid SI series (manufactured by Sanshin Chemical Industry Co., Ltd.), CI series (Nippon Soda Co., Ltd.), WPAG series (manufactured by Wako Pure Chemical Industries, Ltd.), and CPI series (manufactured by San-Apro Ltd.). The sulfonium salt type products are preferable among the above in terms of curability at a relatively low temperature.

The photo-cationic curing catalyst is also called an optical acid generator or an optical cationic polymerization initiator, and it exhibits a substantial function as a curing agent in response to light irradiation. Preferable examples of the above-mentioned photo-cationic curing catalyst include sulfonium based catalysts such as triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, and 4-chlorophenyldiphenylsulfonium hexafluoroantimonate; sulfide based catalysts such as bis[4-(diphenylsulfonio)phenyl]sulfide bishexafluorophosphate and bis[4-(diphenylsulfonio)phenyl]sulfide bishexafluoroantimonate; ferrocene based catalysts, such as (2,4-cyclopentadien-1-yl) [(1-methylethyl) benzene]-Fe-hexafluorophosphate; iodonium based catalysts such as diallyliodonium hexafluoroantimonate and the like.

Preferred as the specific examples of commercial products of the photo-cationic curing catalyst are diazonium salt type, iodonium salt type, and sulfonium salt type products such as UVI-6950, UVI-6970, UVI-6974, and UVI-6990 (manufactured by Union Carbide Corporation); Adeca Optomer SP-150, SP-151, SP-170, and SP-172 (manufactured by ADEKA CORPORATION); Irgacure 250 (manufactured by Ciba Japan); CI-2481, CI-2624, CI-2639, and CI-2064 (manufactured by Nippon Soda Co., Ltd.); CD-1010, CD-1011, and CD-1012 (manufactured by Sartomer Company Inc.); DTS-102, DTS-103, NAT-103, NDS-103, TPS-103, MDS-103, MPI-103, and BBI-103 (manufactured by Midori Kagaku Co., Ltd.); PCI-061T, PCI-062T, PCI-020T, and PCI-022T (manufactured by Nippon Kayaku Co., Ltd.); CPI-100P, CPI-101A, and CPI-200K (manufactured by San-Apro Ltd.); San-Aid SI-60L, San-Aid SI-80L, San-Aid SI-100L, San-Aid SI-110L, San-Aid SI-145, San-Aid SI-150, San-Aid SI-160, and San-Aid SI-180L (manufactured by Sanshin Chemical Industry Co., Ltd.); and WPAG series (manufactured by Wako Pure Chemical Industries, Ltd.).

The resin composition may contain an antioxidant, a reactive diluent, a saturated compound having no unsaturated bonds, a pigment, a dye, an antioxidant, an ultraviolet absorber, a light stabilizer, a plasticizer, a non-reactive compound, a chain transferring agent, a thermal polymerization initiator, an anaerobic polymerization initiator, a polymerization inhibitor, an inorganic filler, an organic filler, an adhesion improver such as a coupling agent, a thermal stabilizer, an antibacterial and antifungal agent, a flame retardant, a delustering agent, a defoaming agent, a leveling agent, a wet dispersant, a sedimentation inhibitor, a thickener, a dripping inhibitor, a color separation inhibitor, an emulsifier, a slip and scratch inhibitor, a skin-covering inhibitor, a drying agent, an antifouling agent, an antistatic agent, a conductive agent (an electrostatic aid), etc, in addition to the silica particles and the resin.

The method for producing the silica particles of the present invention (hereinafter, there may be explained as "surface-treated silica particles") is not particularly limited, and the method preferably includes a step of surface-treating silica particles (hereinafter, there may be explained as "untreated silica particles") with the above-mentioned silicon compound represented by the general formula (1).

Preferred as the above-mentioned untreated silica particles are those having small amount of isolated silanol groups and, for example, the isolated silanol group concentration of the surface of the untreated silica particles is preferably not more than 0.065 mmol/m$^2$, more preferably not more than 0.060 mmol/m$^2$, even more preferably not more than 0.055 mmol/m$^2$, and particularly preferably not more than 0.050 mmol/m$^2$. The isolated silanol group concentration of the surface of the untreated silica particles is, for example, preferably not less than 0.010 mmol/m$^2$, more preferably not less than 0.020 mmol/m$^2$, and even more preferably not less than 0.025 mmol/m$^2$.

The isolated silanol group concentration of the surface of the untreated silica particles can be measured by the lithium aluminum hydride method, for example. The lithium aluminum hydride method is a quantitative determination method of the isolated silanol group concentration by measuring the amount of the hydrogen which is generated by the reaction with lithium aluminum hydride in a solvent (e.g., dioxane) after sufficiently drying amorphous silica particles under prescribed conditions (e.g., a pressure of not more than 6.6 kPa, a temperature of 120° C., and a time of not less than 1 hour). At this time, the specific surface area of untreated silica particles can be measured by the BET method.

In the untreated silica particles, it is preferred that the ratio of the peak area B, which corresponds to a silicon atom to which two condensation groups are attached, to the peak area A, which corresponds to a silicon atom to which no condensation groups are attached, B/A ratio, is less than 1.0% in a $^{29}$Si solid NMR spectrum. The B/A ratio is preferably not more than 0.9%, more preferably not more than 0.8%, even more preferably not more than 0.7%, particularly preferably not more than 0.1%, and most preferably 0%.

The $^{29}$Si solid NMR spectrum of the untreated silica particles of the present invention is obtained by performing $^{29}$Si solid NMR measurement using tetramethylsilane as an internal standard substance, for example. Then, the resulting peak is subjected to peak analysis and peak separation using a Gaussian function, and thus a peak area A corresponding to a silicon atom to which no condensation groups are attached and a peak area B corresponding to a silicon atom to which two condensation groups are attached can be determined.

The specific surface area of the untreated silica particles is preferably not less than 1 m$^2$/g, more preferably not less than 2 m$^2$/g, even more preferably not less than 5 m$^2$/g, and it is preferably not more than 100 m$^2$/g, more preferably not more than 70 m$^2$/g, even more preferably not more than 50 m$^2$/g.

It is preferable that the untreated silica particles to be used for the present invention have reduced content of metal (e.g., transition metal, such as Fe; alkali metal, such as Na; and alkaline earth metal, such as Ca) as impurities; for example, the content of impurity metal is preferably not more than 0.01% by mass, more preferably not more than 0.001% by mass, in the untreated silica particles.

The untreated silica particles are preferably a calcined silica particles which have gone through a calcination step described in the following. Since alkoxy groups located on the surface of the silica particles are removed by calcination, the reactivity with a silicon compound is further improved.

The volume average particle diameter of the untreated silica particles is preferably not less than 0.01 μm, more preferably not less than 0.05 μm, and even more preferably not less than 0.07 μm, and it is preferably not more than 5 μm, more preferably not more than 4 μm, and even more preferably not more than 3 μm. The variation coefficient of the volume average particle diameter of the untreated silica particles is preferably not more than 30%, more preferably not more than 20%, even more preferably not more than 15%. The volume average particle diameter of the untreated silica particles can be measured by a laser diffraction/scattering method.

A surface treatment method of the untreated silica particles can appropriately be determined as long as the silica particles of the present invention is produced. For example, the above-mentioned silicon compound as a surface treatment agent may be dropped to untreated silica while stirring the untreated silica in a mixing device known in the art, such as a Henschel mixer.

In the present invention, it is preferred to surface-treat the untreated silica particles in a dry system. It becomes possible to reduce the amount of isolated silanol groups remaining in surface-treated silica particles and to achieve surface treatment with a higher concentration. In order to perform surface treatment in a dry system, the amount of the untreated silica particles is preferably adjusted to not less than 60 parts by mass, more preferably not less than 70 parts by mass, even more preferably not less than 80 parts by mass relative to 100 parts by mass in total of the untreated silica particles and water to be used for the surface treatment and an organic solvent, a catalyst, etc. to be optionally used. The upper limit of the content of the untreated silica particles is 99.9 parts by mass, for example.

At the time of dropping, it is preferred to atomize the silicon compound and spray it to untreated silica particles. It can improve the uniformity of surface treatment.

The diameter of a spray nozzle for atomizing the silicon compound is preferably not less than 50 μm and not more than 300 μm, more preferably not less than 100 μm and not more than 200 μm, for example. The size of the silicon compound droplet can be adjusted and the uniformity of surface treatment and productivity can be controlled.

Moreover, the silicon compound is dropped preferably in an addition amount of not less than 50 mL/min, more preferably not less than 100 mL/min, and preferably not more than 200 mL/min, more preferably not more than 150 mL/min.

The temperature at the time of the drop of the silicon compound is preferably not less than 10° C. and not more than 40° C., more preferably not less than 20° C. and not more than 35° C.

Moreover, the silica particles are placed in an atmosphere of nitrogen or the like during the drop of the surface treatment agent (silicon compound).

After dropping the surface treatment agent (silicon compound), it is preferred to heat the mixture of the silica particles and the surface treatment agent (silicon compound). The heating temperature is preferably not less than 100° C. and not more than 250° C., more preferably not less than 120° C. and not more than 230° C., even more preferably not less than 150° C. and not more than 200° C. The heating time is preferably not less than 1 hour and not more than 10 hours, more preferably not less than 2 hours and not more than 8 hours, even more preferably not less than 3 hours and not more than 6 hours.

In the surface treatment step, it is preferred to perform surface treatment with water mixed with the silicon compound. The surface treatment efficiency increases by hydrolyzing an alkoxy group, acyloxy group, or the like contained in the silicon compound to form hydroxy group before the drop to untreated silica particles. The molar ratio of the water to the silicon compound is preferably not less than 1, more preferably not less than 1.2, and preferably not more than 3, more preferably not more than 2.5. By performing surface treatment under the condition, the silicon compound reacts with the surface of silica particles uniformly and the silica particles are obtained in which the amount of a hydrolysis polycondensate from only the silicon compound and the amount of silica particles aggregation is suppressed. The silicon compound to be used here is preferably a silicon compound represented by the above general formula (1).

When the silicon compound is treated with water beforehand, an organic solvent, described in the following, may optionally be added with water with stirring. The pretreatment of the silicon compound with water is preferably continued until the mixture becomes transparent.

In the surface treatment step, it is also possible to further mix an organic solvent with the silicon compound and water. Examples of the organic solvent are not particularly limited and include alcohols such as methanol, ethanol, isopropanol, and butanol; ketones such as acetone and methyl ethyl ketone; and ethers such as diethyl ether and tetrahydrofuran. Among them, preferred are alcohols, such as methanol, ethanol, and isopropanol; and ketones, such as acetone; ethers, such as tetrahydrofuran, and more preferred are alcohols, such as methanol and ethanol since they can be mixed homogeneously with the silicon compound and water. When the silicon compound has an alkoxy group, an alcohol having a structure of the same alkoxy group with the silicon compound is preferred. Organic solvents may be used solely or two or more of them may be used in combination.

In the case where an organic solvent is used, the amount of the organic solvent relative to 1 part by mass of water is preferably not less than 1.0 part by mass, more preferably not less than 2 parts by mass, even more preferably not less than 3 parts by mass and is preferably not more than 10 parts by mass, more preferably not more than 7 parts by mass, even more preferably not more than 5 parts by mass.

It is possible either to add or not to add a catalyst in addition to the silicon compound and water during the surface treatment step. As the catalyst, available are catalysts known in the art including acid catalysts such as acetic acid and base catalysts such as ammonia. In the case where a catalyst is used, it is preferred not to bring the silicon compound into contact with the catalyst before dropping the silicon compound to untreated silica particles.

The use amount of the surface treatment agent (silicon compound) is preferably not less than 0.1% by mass relative to 100% by mass of the unreacted silica and is preferably not more than % by mass, more preferably not more than 20% by mass, even more preferably not more than 10% by mass.

The use amount of the surface treatment agent is preferably not less than 0.1 times by mass and is preferably not more than 20 times by mass, more preferably not more than 15 times by mass relative to the theoretical treatment amount which is calculated from the specific surface area of silica and the theoretical minimum covering area that is intrinsic to the surface treatment agent.

The theoretical treatment amount is calculated from the following formula.

Theoretical treatment amount (g)={weight (g) of silica×specific surface area (m$^2$/g) of silica}/ theoretical minimum covering area of surface treatment agent (m$^2$/g)

The theoretical minimum covering area can be determined with the following formula.

Theoretical minimum covering area (m$^2$/g)={Avogadro's number $N_A$ (mol$^{-1}$)×13×10$^{-20}$ (m$^2$)}/molecular weight (g/mol) of the silane coupling agent The known methods in the art can be employed as a method for obtaining untreated silica particles before surface treatment, and the method preferably includes step (1) where silica particles are produced by hydrolyzing and condensing an alkoxysilane because silica particles can be obtained with small variation coefficient and high sphericity thereby. Preferred are those obtained from a production method including step (2) where calcined silica particles are produced by calcining the silica particles from step (1) at a temperature of not less than 650° C. and not more than 1180° C. Hereinafter, the silica particles are explained as uncalcined silica particles which are produced by the hydrolysis and the condensation of step (1) and unsubjected yet to the treatment by the calcination step of step (2).

The explanation for the step (1) of producing the silica particles (hereinafter also referred to as silica particle production step) is provided in the following. The step is preferably a step of producing silica particles by hydrolyzing and condensing an alkoxysilane in the presence of a basic catalyst and water in an organic solvent.

Examples of the alkoxysilane include tetraalkoxysilanes, such as tetramethoxysilane, tetraethoxysilane, tetraisopropoxysilane, tetrabutoxysilane, and dimethoxydiethoxysilane; alkyltrialkoxysilanes, such as methyltrimethoxysilane and methyltriethoxysilane; dimethyldimethoxysilane, dimethyldiethoxysilane dialkyldialkoxysilane; trialkylalkoxysilanes, such as trimethylmethoxysilane and trimethylethoxysilane; chloroalkyl group-containing alkoxysilanes, such as 3-chloropropylmethyldimethoxysilane and 3-chloropropyltrimethoxysilane; vinyl group-containing alkoxysilanes, such as vinyltrimethoxysilane and vinyltriethoxysilane; aromatic group-containing alkoxysilanes, such as phenyltrimethoxysilane, phenyltriethoxysilane, diphenyldimethoxysilane, and diphenyldiethoxysilane; glycidyl group-containing alkoxysilanes, such as 3-glycidoxypropyltrimethoxysilane, 3-glycidoxypropylmethyldimethoxysilane, and 3-glycidoxypropylmethyldiethoxysilane; mercapto group-containing alkoxysilanes, such as 3-mercaptopropyltrimethoxysilane; and amino group-containing alkoxysilanes, such as 3-(2-aminoethylamino)propyltrimethoxysilane. These alkoxysilanes may be used solely or two or more of them may be used in appropriate combination. Among the above examples of alkoxysilanes tetraalkoxysilanes are preferred, and tetramethoxysilane and tetraethoxysilane are more preferred.

The method of adding and mixing an alkoxysilane, a basic catalyst, water and an organic solvent is not particularly limited, and various methods can be employed: such as a method of adding an alkoxysilane to an organic solvent containing a basic catalyst and water at one time with stirring, a method of adding an alkoxysilane in several portions while stirring an organic solvent containing a basic catalyst and water, and a method of continuously adding an alkoxysilane while stirring an organic solvent containing a basic catalyst and water, for example. It is also possible to add the solvent in which an alkoxysilane is dissolved in an organic solvent to an organic solvent containing a basic catalyst and water using the above-described various methods after preparing the solution beforehand. The timing of adding and mixing an alkoxysilane, a basic catalyst, water, and an organic solvent may be conditioned suitably.

Examples of the basic catalyst include ammonia; ammonia generators capable of generating ammonia by heating, such as urea; aliphatic amines, such as methylamine, ethylamine, propylamine, n-butylamine, dimethylamine, dibutylamine, trimethylamine, and tributylamine; alicyclic amines, such as cyclohexylamine; aromatic amines, such as a benzylamine (hereinafter, aliphatic amines, alicyclic amines and aromatic amines are collectively called "amines"); quaternary ammonium hydroxides, such as tetramethylammonium hydroxide; quaternary ammonium salts, such as tetramethylammonium chloride; and alkanolamines, such as monoethanolamine, diethanolamine, and triethanolamine.

Among them, ammonia, amines, and alkanolamines are preferred in terms of obtaining silica particles with controlled particle diameter. Ammonia and aliphatic amines having carbon atoms of not less than 1 and not more than 4 are preferred since they have low boiling point and the residual amount tends to be decreased in resulting silica particles and a dispersion thereof. Moreover, ammonia is particularly preferred since the effect can be highly obtained that a hydrolysis reaction of an alkoxysilane and water is promoted, and also the residual amount tends to be decreased in the resulting silica particles and a dispersion thereof.

The organic solvent may be a compound that is capable of dissolving an alkoxysilane, and also capable of dissolving a basic catalyst and water or dispersing uniformly a basic catalyst and water in a state where the basic catalyst and water are assembled (in a micellar state). Examples of the organic solvent include alcohols, such as methanol, ethanol, isopropyl alcohol, n-butyl alcohol, tert-butyl alcohol, pentyl alcohol, ethylene glycol, propylene glycol, and 1,4-butanediol; ketones, such as acetone and methyl ethyl ketone; esters, such as ethyl acetate; (cyclo) paraffins, such as isooctane and cyclohexane; (cyclic) ethers, such as dioxane and diethyl ether; and aromatic hydrocarbons, such as benzene and toluene. These organic solvents may be used solely or two or more of them may be used in appropriate combination. Among the above examples of organic solvents, alcohols are particularly preferred. An organic solvent immiscible with a basic catalyst and water can also be used, and a surfactant may be added in this case in order to disperse a basic catalyst and water uniformly.

The concentration of the alkoxysilane contained in the organic solvent is preferably not less than 0.05 mol/L and is preferably not more than 3.0 mol/L. The concentration of the water is preferably not less than 0.1 mol/L, more preferably not less than 2 mol/L. The concentration of the water is preferably not more than 50 mol/L, more preferably not more than 25 mol/L. The concentration of the basic catalyst is preferably more than 0.1 mol/L, and more preferably not less than 0.8 mol/L. The concentration of the basic catalyst is preferably not more than 10 mol/L, more preferably not more than 9.4 mol/L.

The reaction temperature at the time of hydrolyzing and condensing the alkoxysilane is preferably not less than 0° C., more preferably not less than 10° C., even more preferably not less than 20° C. The reaction temperature is preferably not more than 100° C., more preferably not more than 70° C., even more preferably not more than 50° C. When the reaction temperature is not less than 0° C., a hydrolysis and a condensation reaction proceed rapidly, and when it is not more than 100° C., the hydrolysis and the condensation reaction may be controlled easily. The aforementioned reaction temperature means the temperature of a reaction solution.

The reaction time at the time of hydrolyzing and condensing the alkoxysilane is preferably not less than 30 minutes, more preferably not less than 1 hour, even more preferably not less than 2 hours. The reaction time is preferably not more than 100 hours, more preferably not more than 20 hours, even more preferably not more than 10 hours. When the reaction time is not less than 30 minutes, a hydrolysis and a condensation reaction advance sufficiently, and when the reaction time is not more than 100 hours, the energy necessary for the heat treatment can be suppressed low and the productivity improves.

Accordingly, the most preferred reaction condition at the time of hydrolysis and condensation is that the concentration of the alkoxysilane contained in the organic solvent is within the range of not less than 0.05 mol/L and not more than 3.0 mol/L, the concentration of the water is within the range of not less than 2 mol/L and not more than 25 mol/L, the concentration of the basic catalyst is within the range of not less than 0.8 mol/L and not more than 9.4 mol/L, the reaction temperature is within the range of not less than 20° C. and not more than 50° C., and the reaction time is within the range of not less than 2 hours and not more than 10 hours. By hydrolyzing and condensing an alkoxysilane in an organic solvent containing a basic catalyst and water, the dispersion liquid tend to be obtained readily which contains silica particles that are spherical and uniform in the particle diameter.

Since the concentration of the alkoxysilane contained in the organic solvent, the concentration of the basic catalyst, the concentration of the water, and the reaction temperature may influence the particle diameter of silica particles, etc., it is preferred to adjust them appropriately according to a desired average particle diameter and desired particle size distribution.

As a result of the hydrolysis and the condensation reaction, nearly spherical silica particles having an average particle diameter of not less than 0.01 µm and not more than 3 µm and a variation coefficient of particle diameter of not more than 50%, and being excellent in dispersibility are obtained in the form of a dispersion liquid, in which the particles are dispersed in an organic solvent in a silica particle concentration of not less than 0.3% by mass and not more than 18% by mass.

In the dispersion, coarse particles or agglomerated particles may be contained which were generated during the hydrolysis and the condensation reaction. In such a case, the removal of eh coarse particles, agglomerates and the like may be performed by passing the dispersion liquid through a filter having a pore diameter that is larger than the average particle diameter of the silica particles by not less than 1 µm. The filter may be a mesh having appropriately determined openings or opening diameters.

In order to subject the resultant uncalcined silica particles to the step (2) of calcining the particles to obtain calcined silica particles (hereinafter, also referred to as calcination step), the uncalcined silica particles are preferably isolated from a dispersion containing the uncalcined silica particles, and more preferably the isolated uncalcined silica particles are dried (hereinafter, there may be provided a description in which uncalcined silica particles before drying are called wet silica particles and uncalcined silica particles after drying are called dried silica particles). The method for the isolation is not particularly limited. For example, isolation methods known in the art such as filtration and centrifugation may be employed. Alternatively, separation and drying can be carried out at the same time by an evaporation method in which the dispersion is heated to evaporate the solvent. The above-mentioned methods may further be combined.

During the preparation of dried uncalcined silica particle powder by separating the uncalcined silica particles from a dispersion containing the uncalcined silica particles, it is preferable to suppress the aggregation and the flocculation of the uncalcined silica particles. From such a viewpoint, it is preferred to adopt a flash dry system or a spray dry system as a method of preparing a dried silica particle powder. It is possible to subject the silica particles dispersion to the above-mentioned dry system as obtained via a hydrolysis and a condensation reaction of an alkoxysilane, and it is preferred to utilize the concentrated dispersion as feedstock after preparing a concentrated silica particle dispersion via a concentration operation of evaporating a portion of the solvent by heating the dispersion, in terms of obtaining a powder with suppressed aggregation, flocculation, etc.

When a flash dry system is adopted, aggregation of uncalcined silica particles is suppressed by the collision with air flow and/or the inner wall of a drier. As the system for heating dispersion, either a direct heating system or an indirect heating system may be employed. In the direct heating system, the solvent of the concentrated dispersion liquid can be evaporated by bringing the hot air generated by a hot air generation furnace or the like into contact with the dispersion liquid, and the disintegration can be promoted for the uncalcined silica particles aggregation that derives from the solvent evaporation. In the indirect heating system, the solvent of a concentrated dispersion can be evaporated by heating the dispersion via a heat conductive material, and the disintegration of the uncalcined silica particles aggregation can be promoted with the air flow introduced from the outside or air flow circulating in the inside.

When a spray dry system is adopted as a drying method, the dispersion of the concentrated dispersion and the disintegration of uncalcined silica particles aggregation can be promoted by spraying the dispersion. In order to suppress the aggregation of the silica particles associated with the dispersion solvent evaporation, an instantaneous vacuum drying method is preferable as the spray dry system, in which the dispersion solvent is evaporated by both heating of the solvent instantaneously to high temperature and vacuum exhaustion to maintain the pressure in the drying system at a low pressure. In order to disintegrate the uncalcined silica particles aggregation sufficiently, the preferable apparatus that may be adopted should have a tube composed of a straight and a bent part where the solvent evaporates, and should be capable of feeding a dispersion from the inlet side (the straight part side) of the tube while vacuum-exhausting from the outlet side (the bent part side) of the tube. The aggregation will be disintegrated through the collision of the aggregate against the wall of the bent part with such an apparatus, even if aggregation of uncalcined silica particles occurred associated with the solvent evaporation.

Usually, in a silica particles (especially, in an uncalcined silica particles), a part of silicon atoms in a silica particles (especially, in an uncalcined silica particles) are bonded by alkoxy groups that derives from the alkoxysilane used as a raw material for a hydrolysis condensation reaction or, alkoxy groups that derives from the alcohol in the case where an alcohol was used as an organic solvent.

Since the uncalcined silica particles obtained in the silica particle production step is bonded by the alkoxy groups or the like for the reason described above, it is preferred to perform calcination under specific conditions in order to remove the attached alkoxy groups derived from an alcohol, etc. and prepare the silica with an isolated silanol group content and a specific surface area falling within specific ranges.

The calcination step is a suitable step to convert uncalcined silica particles into the calcined silica particles with the above-described characteristics.

The calcination temperature in this step is preferably not less than 650° C., more preferably not less than 800° C. and is preferably not more than 1180° C., more preferably not more than 1150° C. When the calcination temperature is less than 650° C., hygroscopicity does not decrease sufficiently and an organosilyl group may decompose. When the calcination temperature exceeds 1180° C., it is concerned that silica particles are fused together to aggregate.

The atmosphere during the calcination is not particularly limited and both an oxidative atmosphere, such as air and nitrogen-oxygen mixed gas, and an inert gas atmosphere, such as nitrogen gas, argon gas and helium gas, are employable, and an oxidative atmosphere is preferred. The alkoxy groups attached to the silica particles (especially, the uncalcined silica particles) may be burned and removed efficiently and a condensation reaction may be to promoted between silanols that has been formed associated with elimination of alkoxy groups.

The uncalcined silica particles are heated up from normal temperature and heated at a calcination temperature for a prescribed period of time in a heating furnace at the time of calcination. The temperature ramp-up rate is not particularly limited, and it is preferably 0.5 to 10° C./minute because a combustion residue of alkoxy groups becomes unlikely to be generated. The temperature ramp-up rate is more preferably 1 to 5° C./minute. The heat holding time at the calcination temperature is not particularly limited, and it is preferably 0.5 to 20 hours, more preferably 1 to 12 hours, particularly preferably 2 to 6 hours.

It is preferred to cool the silica particles after holding heat at the calcination temperature for a prescribed period of time. The temperature ramp-down rate in cooling is preferably 0.5 to 10° C./minute, more preferably 1 to 5° C./minute.

The calcined silica particles may be partially aggregated, fused, or flocculated, and in order to control the variation coefficient of the calcined silica particles, etc., disintegration and/or classification may be performed after at least one of the steps that is previously described. The disintegration and the classification may be performed with different devices such as a disintegrator (pulverizer) and a classifier or alternatively may be performed with one device such as a disintegrating classifier (pulverizing classifier) to perform classification along with disintegration. Disintegration treatment can disintegrate aggregated, fused or flocculated particles into individual particles. Classification treatment is performed in order to remove undisintegrated coarse silica particles in the possible case where all particles had not been disintegrated by the disintegration treatment.

The system of the disintegration treatment is not particularly limited, and a method using a jet mill, a ball mill, or the like is preferred since the material to be treated has a very small particle diameter. The system of the classification treatment is not also particularly limited, and an air flow system or the like is preferred since the material to be treated is very small. A jet milling classifier (IDS-2 type manufactured by Nippon Pneumatic Mfg. Co., Ltd.) can be used as a device for disintegration and classification simultaneously for example.

The silica particles (surface-treated silica particles) of the present invention are capable of being applied to known applications where various silica particles can be used, e.g., antiblocking agents and lubricating agents for various kinds of films such as a polyester film, a polyimide film, and a fluororesin film; spacers such as an in-plane spacer for liquid crystal display elements, a spacer at a seal part for liquid crystal display elements, a spacer for EL display elements, a spacer for touch panels, and a gap-retaining material for various types of substrates such as ceramics, plastics, and the like; encapsulants for various electronic components such as a semiconductor encapsulant, a sealing material for liquid crystal, and an encapsulant for LED light emitting elements; light diffusion agents for light diffusion films, light diffusion plates, light-guiding plates, antiglare films, and the like; additives for cosmetics, such as white extender pigments; and dental materials. Especially, the silica particles are preferably used as fillers for encapsulants for various electronic components such as a semiconductor encapsulant, a sealing material for liquid crystal, and an encapsulant for LED light emitting elements since they are improved in surface characteristics and affinity with a resin.

The present application claims benefit of the priority based on Japanese Patent Application No. 2014-022983 filed on Feb. 10, 2014. The disclosure of the specification of Japanese Patent Application No. 2014-022983 filed on Feb. 10, 2014 is incorporated herein by reference in its entirety.

EXAMPLES

The present invention will be described in detail in the following by way of Examples, however the present invention is not limited by the following Examples, and modifications which do not depart from the spirit and scope of the present invention are allowed and embraced within the technical scope of the present invention.
(XPS)

For silica particles, the abundance ratios (mol %) of C and Si atoms were measured by X-ray photoelectron spectrometry (XPS) under the following conditions, and then C/Si ratio at a silica particle surface was calculated. Specifically, the area ratio of a C1s peak and a Si2s peak in the measured chart (refer to FIG. 1) was calculated and it was taken as the C/Si ratio in X-ray photoelectron spectrometry (XPS).
<Measurement Conditions>

Model name: "Quantera SXM" manufactured by ULVAC-PHI

Specimen: 2 mm in diameter and 0.4 mm in thickness

Light source: Al K□, beam diameter=100 μm, beam power=25 W–15 kV

Measurement: range=0 to 1100 eV, cumulated number 14 times
(Average Particle Diameter)

A mixture prepared by mixing 1 g of a silica particles sample with 9 g of methanol was dispersed by performing ultrasonic dispersion for 10 minutes or more to prepare a sample for measurement. The sample was measured by using a laser diffraction/scattering particle size distribution analyzer (LA-920 manufactured by Horiba, Ltd.). The arithmetic average of the resulting particle size distributions on volume basis was taken as an average particle diameter.
(Variation Coefficient)

The variation coefficient of particle diameter was calculated as follows from the average particle diameter and the standard deviation of particle diameter determined from measurement with the above-mentioned laser diffraction/scattering particle size distribution analyzer.

Variation coefficient (%)=(standard deviation of particle diameter)/(average particle diameter)×100

(Method for Measuring Unreacted Silicon Compound)

A mixture prepared by mixing 10 g of a silica particles sample with 90 g of methanol is brought into a slurry state by performing ultrasonic dispersion for one hour or more. After the slurrying, the mixture was separated into solid and liquid by centrifugation, and 10 g of the resultant supernatant liquid was taken as a sample to be measured. The sample to be measured was put into a weighing container and was heat treated at 110° C. for one hour at rest, then it was cooled to room temperature under a dry atmosphere. When the weight increase of the weighing container through the operation is termed as the residual amount after heating, the residual amount after heating corresponds to the unreacted silicon compound contained in the 10 g of the supernatant liquid because the unreacted silicon compound contained in 10 g of the silica particles sample is considered to have been eluted into 90 g of methanol. Accordingly, for 1 g of silica particles, the amount of an unreacted silicon compound contained in the silica particles was calculated from the following formula.

Amount of the unreacted silicon compound (% by weight)=residual amount after heating (g)×9/10×100

(Viscosity of Resin Composition)

The viscosity of a resin composition was measured at room temperature (25° C.) using a BROOKFIELD RST-CPS Rheometer (manufactured by BROOKFIELD) (revolution speed: 5 rpm).

Example 1

A 200 L reactor equipped with a stirrer, a dropping device, and a thermometer was charged with 67.54 kg of methanol and 24.30 kg of 28% by mass ammonia water (water and a catalyst) and then the liquid temperature was adjusted at 40±0.5° C. under stirring. On the other hand, a solution in which 10.76 kg of tetramethoxysilane was dissolved in 4.61 kg of methanol was charged into the dropping device. While keeping the liquid temperature in the reactor at 40±0.5° C., the above solution was dropped from the dropping device over one hour, and after the completion of the dropping, stirring was continued for additional one hour while keeping the liquid temperature at the above temperature. Hydrolysis and condensation of tetramethoxysilane were thereby performed, and a dispersion liquid containing a silica particle precursor was obtained.

The dispersion liquid was flash-dried using an instantaneous vacuum evaporating apparatus, thereby obtaining dried silica particles. Crux-system 8B-type (manufactured by Hosokawa Micron Corporation) was employed as the instantaneous vacuum evaporating apparatus. The employed drying conditions include a heating tube temperature of 175°

C. and a degree of pressure reduction of 200 torr (27 kPa). The instantaneous vacuum evaporating apparatus is equipped with a stainless steel tube of 8 mm in inner diameter and 9 m in length covered with a jacket into which heated water vapor is to be supplied, a feeding section to feed a dispersion liquid containing a silica particle precursor to one end of the steel tube, and to the other end of the steel tube, a powder collecting chamber is connected where it is kept under reduced pressure and a bag filter is equipped for the separation of a powder and a vapor. In the steel tube, the dispersion liquid containing a silica particle precursor fed from the feeding section is heated indirectly, so that the solvent is vaporized, and at the same time, dispersion of the dispersion liquid containing the silica particle precursor are promoted as well as the disintegration of the silica particle precursor by the air flow produced by reducing the pressure on the powder collecting side. The powder is transferred in the steel tube by the air flow produced by reducing the pressure on the powder collecting side and is collected with the bag filter. The vapor is discharged out of the apparatus after passing through the bag filter and then being condensed.

Thus obtained dried silica particles were placed in a crucible, and calcined at 1050° C. for one hour by using an electric furnace, and the calcined silica particles were obtained after cooling and then grounding with a grinding machine. The calcination temperature is a value obtained by measuring the ambient temperature in the electric furnace.

Three kilograms of the resulting calcined silica particles (specific surface area: 35 $m^2/g$) were charged into a 20 L Henschel mixer with a heating jacket (FM20J type, manufactured by Mitsui Mining Co., Ltd.). The Henschel mixer has a container to which materials to be mixed are placed and a rotary shaft with stirring blades mounted on the bottom of the container, and also a rotary shaft is mounted on the top face of the container with plate-shaped blades arranged so as to extend along the wall surface as a device for scraping wall deposits. While stirring the calcined silica particles, a solution prepared by dissolving 161 g of dimethyldimethoxysilane (KBM-22 produced by Shin-Etsu Chemical Co., Ltd., minimum covered area: 649 $m^2/g$), which is a silicon compound, in 36 g of ion-exchanged water and 320 g of methanol was dropped and mixed. The amount of 161 g is equivalent to the theoretical addition amount of the silicon compound. Then, the mixture of the calcined silica particles and the silicon compound was heated to 150° C. over about one hour and was heat-treated by holding the temperature at 150° C. for 12 hours. The temperature value of 150° C. is the temperature value measured in the mixture of the calcined silica and the silicon compound. The heat treatment was performed while mixing and stirring the mixture of the calcined silica particles and the silicon compound. After the heating, the mixture was cooled and then subjected to disintegration and classification using a jet milling classifier (IDS-2 type manufactured by Nippon Pneumatic Mfg. Co., Ltd.), thereby obtaining silica particles.

Example 2

A 200 L reactor equipped with a stirrer, a dropping device, and a thermometer was charged with 67.54 kg of methanol and 26.33 kg of 28% by mass ammonia water (water and a catalyst) and then the liquid temperature was adjusted at 33±0.5° C. under stirring. On the other hand, a solution in which 13.45 kg of tetraethoxysilane was dissolved in 5.59 kg of methanol was charged into the dropping device. While keeping the liquid temperature in the reactor at 33±0.5° C., the above solution was dropped from the dropping device over one hour, and after the completion of the dropping, stirring was continued for additional one hour while keeping the liquid temperature at the above temperature. Hydrolysis and condensation of tetraethoxysilane were thereby performed, and a dispersion liquid containing a silica particle precursor was obtained. Subsequent operations were performed in the same manner as in Example 1, thereby obtaining calcined silica particles.

Five kilograms of the resulting calcined silica particles (specific surface area: 12 $m^2/g$) were charged into a 20 L Henschel mixer with a heating jacket (FM20J type, manufactured by Mitsui Mining Co., Ltd.). While stirring the calcined silica particles in the same manner as in Example 1, a solution prepared by dissolving 92 g of dimethyldimethoxysilane (KBM-22 produced by Shin-Etsu Chemical Co., Ltd., minimum covered area: 649 $m^2/g$), which is a silicon compound, in 21 g of ion-exchanged water and 180 g of methanol was dropped and mixed. The mass of the added silicon compound was equivalent to the theoretical addition amount of the silicon compound. Under the same conditions as in Example 1 except the above, surface treatment of silica particles was performed.

Example 3

A 200 L reactor equipped with a stirrer, a dropping device, and a thermometer was charged with 67.54 kg of methanol and 26.33 kg of 28% by mass ammonia water (water and a catalyst) and then the liquid temperature was adjusted at 20±0.5° C. under stirring. On the other hand, a solution in which 13.45 kg of tetraethoxysilane was dissolved in 5.59 kg of methanol was charged into the dropping device. While keeping the liquid temperature in the reactor at 20±0.5° C., the above solution was dropped from the dropping device over one hour, and after the completion of the dropping, stirring was continued for additional one hour while keeping the liquid temperature at the above temperature. Hydrolysis and condensation of tetraethoxysilane were thereby performed, and a dispersion liquid containing a silica particle precursor was obtained. Subsequent operations were performed in the same manner as in Example 1, thereby obtaining calcined silica particles.

Five kilograms of the resulting calcined silica particles (specific surface area: 6 $m^2/g$) were charged into a 20 L Henschel mixer with a heating jacket (FM20J type, manufactured by Mitsui Mining Co., Ltd.). While stirring the calcined silica particles in the same manner as in Example 1, a solution prepared by dissolving 46 g of dimethyldimethoxysilane (KBM-22 produced by Shin-Etsu Chemical Co., Ltd., minimum covered area: 649 $m^2/g$), which is a silicon compound, in 14 g of ion-exchanged water and 92 g of methanol was dropped and mixed. The mass of the added silicon compound was equivalent to the theoretical addition amount of the silicon compound. Under the same conditions as in Example 1 except the above, surface treatment of silica particles was performed.

Example 4

A 200 L reactor equipped with a stirrer, a dropping device, and a thermometer was charged with 96.91 kg of ethanol and 24.13 kg of 28% by mass ammonia water (water and a catalyst) and then the liquid temperature was adjusted at 30±0.5° C. under stirring. On the other hand, a solution in which 18.38 kg of tetraethoxysilane was charged into the dropping device. While keeping the liquid temperature in the reactor at 30±0.5° C., the aforementioned solution was dropped from the dropping device over one hour, and after the completion of the dropping, stirring was continued for additional one hour while keeping the liquid temperature at aforementioned temperature. Hydrolysis and condensation of tetraethoxysilane were thereby performed, and a dispersion liquid containing a silica particle precursor was obtained. Subsequent operations were performed in the same manner as in Example 1, thereby obtaining calcined silica particles.

Five kilograms of the resulting calcined silica particles (specific surface area: 3.5 $m^2/g$) were charged into a 20 L Henschel mixer with a heating jacket (FM20J type, manufactured by Mitsui Mining Co., Ltd.). While stirring the calcined silica particles in the same manner as in Example 1, a solution prepared by dissolving 92 g of dimethyldimethoxysilane (KBM-22 produced by Shin-Etsu Chemical Co., Ltd., minimum covered area: 649 $m^2/g$), which is a silicon compound, in 28 g of ion-exchanged water and 180 g of methanol was dropped and mixed. The mass of the added silicon compound was equivalent to the theoretical addition amount of a silane coupling agent. Under the same conditions as in Example 1 except the above, surface treatment of silica particles was performed.

Example 5

Surface-treated silica was prepared from calcined silica by the same operations as in Example 1 except using the calcined silica particles (specific surface area: 3.5 $m^2/g$) obtained in Example 4 and using 184 of dimethyldimethoxysilane, which is a silicon compound, 56 g of ion-exchanged water, and 360 g of methanol. The mass of the added silicon compound was equivalent to twice the theoretical addition amount of the silicon compound. Under the same conditions as in Example 1 except the above, surface treatment of silica particles was performed.

Example 6

Calcined silica was obtained by performing the same operations as in Example 4 except controlling the liquid temperature at 20±0.5° C. during the step of obtaining a dispersion liquid containing a silica particle precursor of Example 4.

Five kilograms of the resulting calcined silica particles (specific surface area: 2 $m^2/g$) were charged into a 20 L Henschel mixer with a heating jacket (FM20J type, manufactured by Mitsui Mining Co., Ltd.). While stirring the calcined silica particles in the same manner as in Example 1, a solution prepared by dissolving 15 g of dimethyldimethoxysilane (KBM-22 produced by Shin-Etsu Chemical Co., Ltd., minimum covered area: 649 $m^2/g$), which is a silicon compound, in 5 g of ion-exchanged water and 30 g of methanol was dropped and mixed. The mass of the added silicon compound was equivalent to the theoretical addition amount of the silicon compound. Under the same conditions as in Example 1 except the above, surface treatment of silica particles was performed.

Example 7

A 200 L reactor equipped with a stirrer, a dropping device, and a thermometer was charged with 70 kg of methanol and 25 kg of 28% by mass ammonia water (water and a catalyst) and then the liquid temperature was adjusted at 20±0.5° C. under stirring. On the other hand, a solution in which 30 kg of tetraethoxysilane was dissolved in 13 kg of methanol was charged into the dropping device. While keeping the liquid temperature in the reactor at 20±0.5° C., the above solution was dropped from the dropping device over one hour, and after the completion of the dropping, stirring was continued for additional one hour while keeping the liquid temperature at the above temperature. Hydrolysis and condensation of tetraethoxysilane were thereby performed, and a dispersion liquid containing a silica particle precursor was obtained. Subsequent operations were performed in the same manner as in Example 1, thereby obtaining calcined silica particles.

Five kilograms of the resulting calcined silica particles (specific surface area: 1 $m^2/g$) were charged into a 20 L Henschel mixer with a heating jacket (FM20J type, manufactured by Mitsui Mining Co., Ltd.). While stirring the calcined silica particles in the same manner as in Example 1, a solution prepared by dissolving 8 g of dimethyldimethoxysilane (KBM-22 produced by Shin-Etsu Chemical Co., Ltd., minimum covered area: 649 $m^2/g$), which is a silicon compound, in 3 g of ion-exchanged water and 16 g of methanol was dropped and mixed. The mass of the added silicon compound was equivalent to the theoretical addition amount of the silicon compound. Under the same conditions as in Example 1 except the above, surface treatment of silica particles was performed.

Comparative Example 1

The calcined silica particles obtained in Example 4 were taken as the sample of Comparative Example 1 having not been subjected to surface treatment.

Comparative Example 2

Five kilograms of the calcined silica particles (specific surface area: 3.5 $m^2/g$) obtained in Example 4 were charged into a 20 L Henschel mixer with a heating jacket (FM20J type, manufactured by Mitsui Mining Co., Ltd.). While stirring the calcined silica particles in the same manner as in Example 1, a solution prepared by dissolving 92 g of dimethyldimethoxysilane (KBM-22 produced by Shin-Etsu Chemical Co., Ltd., minimum covered area: 649 $m^2/g$), which is a silicon compound, in 180 g of methanol was dropped and mixed. The mass of the added silicon compound was equivalent to the theoretical addition amount of the silicon compound. Under the same conditions as in Example 1 except the above, surface treatment of silica particles was performed.

The average particle diameter, the variation coefficient of particle diameter, the C/Si ratio in XPS, and the amount of an unreacted silicon compound of the surface-treated silica particles obtained in Examples 1 to 7 and Comparative Examples 1 to 2 are shown in Table 1.

TABLE 1

|  |  | Example | | | | | | | Comparative Example | |
|---|---|---|---|---|---|---|---|---|---|---|
|  |  | 1 | 2 | 3 | 4 | 5 | 6 | 7 | 1 | 2 |
| Average particle diameter | μm | 0.11 | 0.28 | 0.48 | 0.90 | 0.93 | 1.35 | 2.43 | 0.88 | 0.94 |
| Coefficient of variation | % | 12 | 13 | 13 | 12 | 13 | 13 | 14 | 11 | 15 |
| Amount of unreacted silicon compound | mass % | 0.90 | <0.09 | <0.09 | <0.09 | 0.27 | <0.09 | <0.09 | <0.09 | 2.16 |
| C/Si ratio (XPS) |  | 0.16 | 0.14 | 0.18 | 0.14 | 0.16 | 0.10 | 0.08 | <0.01 | 0.02 |

Preparation of Resin Composition

Resin compositions were obtained by mixing 50 parts by mass of the surface-treated silica particles obtained in Example 4 and Comparative Examples 1 to 2 and 50 parts by mass of a bisphenol A type epoxy resin ("jER825 (registered trademark)", produced by Mitsubishi Chemical Corporation) as an epoxy resin. The viscosities of the resulting resin compositions are shown in Table 2.

TABLE 2

|  |  | Example | Comparative Example | |
|---|---|---|---|---|
|  |  | 4 | 1 | 2 |
| Viscosity | Pa · s | 25 | 31 | 39 |

INDUSTRIAL APPLICABILITY

The silica particles of the present invention can suitably be used for antiblocking agents and lubricating agents for various kinds of films such as a polyester film, a polyimide film, and a fluororesin film; spacers such as an in-plane spacer for liquid crystal display elements, a spacer at a seal part for liquid crystal display elements, a spacer for EL display elements, a spacer for touch panels, and a gap-retaining material for various types of substrates such as ceramics, plastics, and the like; encapsulants for various electronic components such as a semiconductor encapsulant, a sealing material for liquid crystal, and an encapsulant for LED light emitting elements; light diffusion agents for light diffusion films, light diffusion plates, light-guiding plates, antiglare films, and the like; additives for cosmetics, such as white extender pigments; dental materials, etc.

The invention claimed is:

1. Surface-treated silica particles, comprising:
a calcined silica particle, and
a surface treatment layer with a silicon compound on the calcined silica particle, wherein
the surface treated layer is not calcined,
C/Si ratio of the surface-treated silica particles from X-ray photoelectron spectroscopy (XPS) is not less than 0.05,
the calcined silica particle has a specific surface area of 35 m$^2$/g or less,
the silicon compound is dimethyldimethoxysilane,
the surface-treated silica particles have the amount of the silicon compound unreacted with the surface of the calcined silica particles of not more than 2% by mass relative to the amount of the silica particles; as measured by a method comprising the successive steps of:
preparing a mixture by mixing 10 g of a silica particles sample with 90 g of methanol, bringing the mixture into a slurry state by performing ultrasonic dispersion for one hour or more;
after the slurrying, separating the mixture into solid and liquid by centrifugation,
taking 10 g of the resultant supernatant liquid as a sample to be measured;
putting the sample to be measured into a weighing container,
heat treating the sample at 110° C. for one hour at rest,
cooling the sample to room temperature under a dry atmosphere;
determining the weight increase of the weighing container through the operation as the residual amount after heating, and
calculating the amount of an unreacted silicon compound contained in the silica particles from the following formula:

Amount of the unreacted silicon compound (% by weight)=residual amount after heating (g)×9/10×100, and when the surface-treated silica particles are mixed with a bisphenol A type epoxy resin, the resulting resin composition has viscosity of not more than 25 Pa·s.

2. The surface-treated silica particles according to claim 1 having an average particle diameter of not less than 0.01 μm and not more than 3 μm.

3. A resin composition comprising the silica particles according to claim 1 and a resin.

4. A semiconductor encapsulant comprising the resin composition according to claim 3.

5. The surface-treated silica particles according to claim 1, wherein the surface-treated silica particles have an average particle diameter of not less than 0.1 μm and not more than 3 μm.

* * * * *